(12) United States Patent
Tolson

(10) Patent No.: US 6,169,447 B1
(45) Date of Patent: Jan. 2, 2001

(54) STABILIZATION OF PASSBAND ACTIVE FILTERS

(75) Inventor: Nigel James Tolson, Berkshire (GB)

(73) Assignee: NEC Corporation, Tokyo (JP)

( * ) Notice: Under 35 U.S.C. 154(b), the term of this patent shall be extended for 0 days.

(21) Appl. No.: 09/397,963

(22) Filed: Sep. 17, 1999

(30) Foreign Application Priority Data

Sep. 18, 1998 (GB) .................................. 9820252

(51) Int. Cl.$^7$ .................................................. H03B 1/00
(52) U.S. Cl. .................................. 327/557; 327/552
(58) Field of Search .................................. 327/551, 553, 327/552, 557, 310, 311

(56) References Cited

U.S. PATENT DOCUMENTS

| | | | |
|---|---|---|---|
| 4,174,501 | * 11/1979 | Chastagnier et al. | 325/56 |
| 4,426,735 | * 1/1984 | Kasperkovitz | 455/222 |
| 5,241,697 | * 8/1993 | Hansen | 455/200 |
| 5,325,070 | 6/1994 | McGinn | 330/256 |
| 5,731,694 | * 3/1998 | Wilcox et al. | 323/287 |

FOREIGN PATENT DOCUMENTS

| | | |
|---|---|---|
| 0 818 884 | 1/1998 | (EP) . |
| 1 404 645 | 9/1975 | (GB) . |

\* cited by examiner

*Primary Examiner*—Toan Tran
*Assistant Examiner*—Hiep Nguyen
(74) *Attorney, Agent, or Firm*—Sughrue, Mion, Zinn, Macpeak & Seas, PLLC

(57) ABSTRACT

A calibrator for stabilization of a passband active filter firstly sets a low level of filter supply current to assure filter stability while the filter is tuned to the required passband. The supply current is then gradually increased until the filter becomes unstable. The supply current level is held constant when filter instability is detected and the current is then reduced by a pre-determined amount to maintain stability of the filter. Re-tuning of the filter may then proceed without risk of instability. May be used as part of a phase locked loop for operating channel selection in a radio.

9 Claims, 3 Drawing Sheets

STABILIZATION OF PASSBAND ACTIVE FILTERS

BACKGROUND OF THE INVENTION

1. Field of the Invention

This invention relates to stabilization of passband active filters such as may be used in radio transmitter/receivers for operating channel selection.

2. Description of the Related Art

In our co-pending application GB 9804708.7 there is described a means for frequency and channel selection for both receiver and transmitter in a radio transmitter/receiver. Included in the exemplary embodiment of the invention given in GB 9804708.7 is a passband active filter. It has been found sometimes to occur that the passband active filters of the type referred to in that embodiment suffer instability.

This instability is caused because the passband active filter consists of a negative resistance generator which acts to cancel out the losses in an associated resonator so improving the Q (Quality) of the circuit. The problem of instability arises when the negative resistance exceeds the losses in the resonator because in such a situation oscillation can occur. These oscillations may occur due to variations in manufacturing tolerances and temperature fluctuations.

SUMMARY OF THE INVENTION

It is an object of this invention to provide a calibrator for a passband active filter to guarantee the stability of the filter while preserving the "Q" performance and to provide a method for such calibration.

In accordance with the invention there is provided a calibrator for stabilization of a passband active filter comprising means for providing a steady increase in filter supply current from a low level at which low level filter stability is assured to a high level at which high level instability occurs and means for setting said filter supply current at a level less by a pre-determined amount than the high level at which instability occurs.

In general a method of calibrating a passband active filter comprises the steps of setting a low level of filter supply current to provide filter stability, tuning the filter to the required passband, ramping up the supply current level, monitoring the filter for instability, holding the supply current level when instability is detected, reducing the supply current by a predetermined amount from the held value and re-tuning the passband active filter.

The above and other objects, features and advantages of the present invention will become apparent from the following description with reference to the accompanying drawings which illustrate examples of the present invention.

DETAILED DESCRIPTION OF THE PREFERRED EMBODIMENTS

Figure 1:
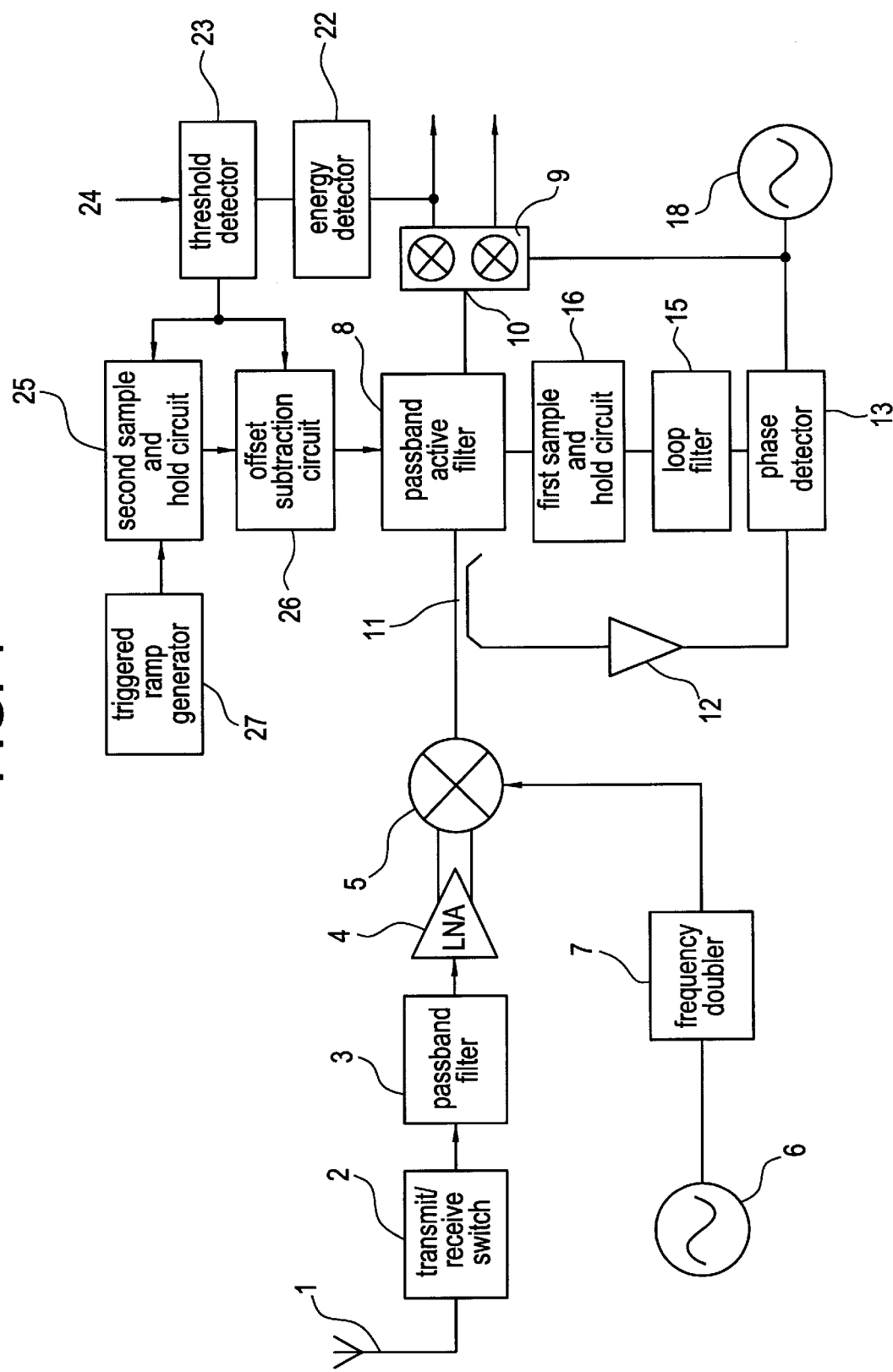
FIG. 1 is a block diagram of part of a radio receiver.

With reference to FIG. 1, a block diagram of part of a GSM radio receiver is shown in which an incoming RF signal from an antenna 1 is fed via transmit/receive switch 2 and passband filter 3 to low noise amplifier 4. The function of low noise amplifier (LNA) 4 is to enhance the signal to noise performance of the receiver and to reduce any unwanted transmission from the receiving antenna at radio frequencies (RF). The amplified signal from LNA 4 is then mixed in first mixer 5 with the output from first local oscillator (LO) 6.

The frequency of LO 6 is fixed and the output from LO 6 is doubled in frequency doubler 7 before passing to first mixer 5, at twice the frequency of LO 6, to mix with the incoming filtered and amplified RF signals to produce an intermediate frequency (IF) output from first mixer 5.

Use of the frequency doubler 7 enables a lower frequency oscillator to be used as a local oscillator which provides an easing of tolerances so as to permit discrete implementation of the oscillator. The output from first mixer 5 is fed to an passband active filter 8 forming part of a phase locked loop (PLL). The passband active filter 8 is a voltage controlled band pass filter and may be constructed as an MMIC active filter. A description of an MMIC active filter can be found in IEEE Transactions on microwave theory arid techniques Volume 37 number 12, December 1989, Manfred J. Schindler and Yusuke Tajima. The bandwidth of passband active filter 8 is sufficient to accommodate a single channel.

The filtered IF signals from passband active filter 8 are fed to second mixer 9. Local oscillator 18 provides an output at the IF of the reception channel required. The isolation of the local oscillator (LO 18) signal from the incoming IF port 10 provided by second mixer 9 is typically only 15 dB and therefore a substantial breakthrough of local oscillator energy to the IF port 10 occurs.

The energy from the local oscillator appearing at IF port 10 passes through passband active filter 8 with a change of phase. The amount and direction of the phase change of the local oscillator breakthrough passing through the passband active filter 8 is determined by the difference between the frequency of the local oscillator breakthrough and the current center frequency of the tunable passband active filter 8.

The local oscillator energy passing through passband active filter 8 is coupled via RF coupler 11 to amplifier 12, where it is amplified and applied to a port of phase detector 13. A further output from local oscillator 18 is fed to a another port of phase detector 13. Phase detector 13 compares the phase of the signals appearing at its ports and provides an output proportional to the difference in phase of the signals.

The output from phase detector 13, the error signal, is fed to loop filter 15 and the output voltage from the loop filter 15 is applied, via first sample and hold circuit 16 to the voltage control input of the passband active filter 8 thereby forming a phase locked loop. The action of the phase locked loop is to drive the center frequency of the passband of filter 8 towards the frequency of the local oscillator, the local oscillator frequency having been set for use with the selected operating channel.

A first sample and hold circuit 16 is included in the control loop between loop filter 15 and passband active filter 8. The first sample and hold circuit 16 is capable of being switched to provide a fixed voltage at the control input of the voltage controlled passband active filter 8. This would occur when the center frequency of passband active filter 8 approximates to the center frequency of the selected channel bandwidth and during "receive" for a TDMA system. When the control voltage for passband active filter 8 is to be maintained at a fixed value, parts of the control circuit are disabled thereby to effect a saving of power during normal operation of the telephone in a single channel.

The receiver phase locked loop does not operate while the first sample and hold circuit 16 supplies a fixed voltage to passband active filter 8. When a different channel is selected the phase locked loop circuit is enabled and the filter is tuned to accept the new channel frequencies.

The I and Q outputs from second mixer 9 which are at baseband frequencies are passed to amplification stages and then to standard processing circuits such as are well known in the art and described in e.g. Mobile Radio Communications' by R. Steele (Ed) 1992 published by John Wiley & Sons.

The receiver shown in FIG. 1 has thus far been described previously in our co-pending application GB 9804708.7 much of that description being repeated here for the sake of clarity. Additional circuitry not previously described and germane to the present invention is included in FIG. 1 as energy detector 22, threshold detector 23, threshold voltage 24, second sample and hold circuit 25, offset subtraction circuit 26 and triggered ramp generator 27.

When the passband active filter 8 becomes unstable it is most likely to oscillate close to the passband of its filter response. This oscillation is then demodulated and detected. As the passband active filter 8 is a negative resistance, the stability of the filter is directly related to the supply current.

The passband active filter 8 does not oscillate in case of little supply current, but it is desirable to make a supply current as large as possible so as not to lower the Q performance of the resonator.

The supply current to the passband active filter 8 is therefore set in the first instance to a safe (low) level such that at this level stability of the filter is assured. The center frequency of the passband active filter is then tuned to the second local oscillator frequency which has been set for use with the selected operating channel.

The supply current to the passband active filter 8 is then increased in a ramp by triggered ramp generator 27 and the energy level at baseband detected by energy detector 22. As the supply current to passband active filter 8 is steadily increased, oscillation will occur at some supply current level and the oscillation will be detected through the increase in energy level in energy detector 22 exceeding the threshold voltage 24.

When the oscillation is detected, the threshold detector 23 provides a hold_enable signal to second sample and hold circuit 25 and the supply current is held at a fixed value (the held value). The supply current to passband active filter 8 is then set to a level lower than the held value by a pre-determined amount thereby returning stability to the passband active filter 8.

When the supply current to passband active filter 8 is set the receiver is ready to receive during the designated time slot. A further frequency calibration (re-tuning the passband active filter) may be performed to allow for any slight changes in center frequency of the filter occurring as a consequence of the ramping of the supply current.

Figure 2:
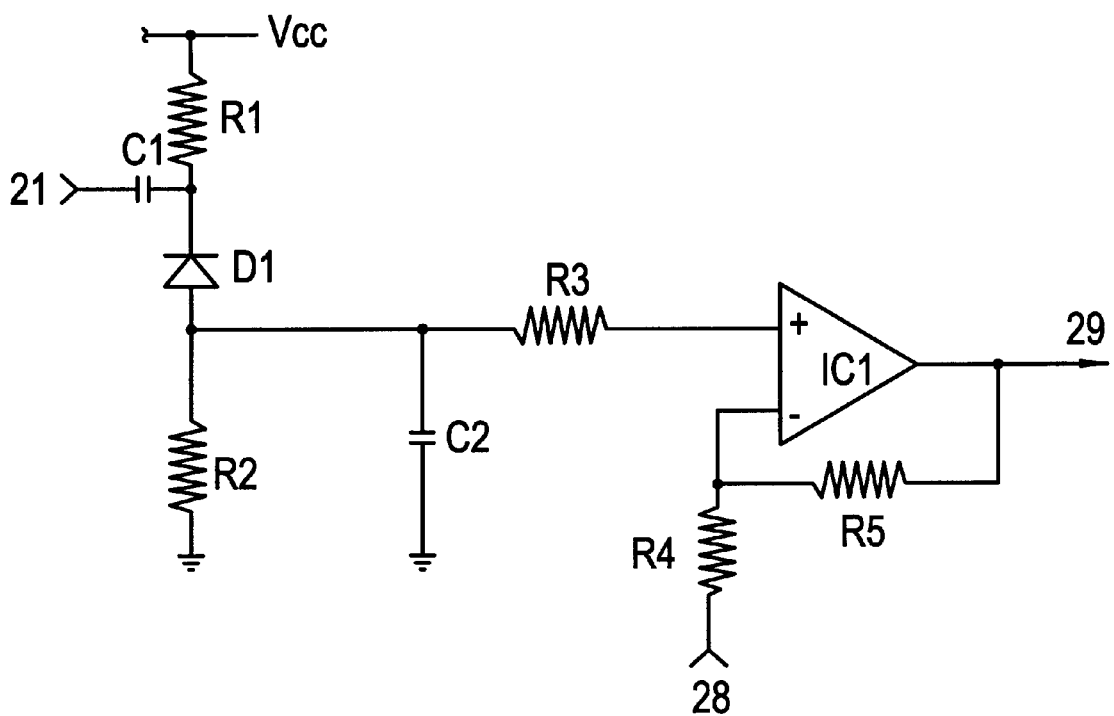
FIG. 2 is a circuit diagram of an energy detector with threshold detect.
Figure 3:
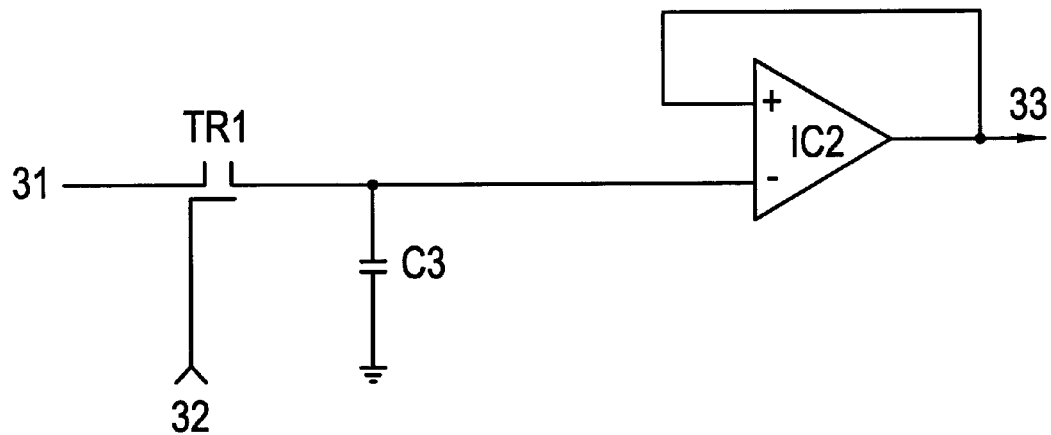
FIG. 3 is a circuit diagram of a sample and hold circuit.
Figure 4:
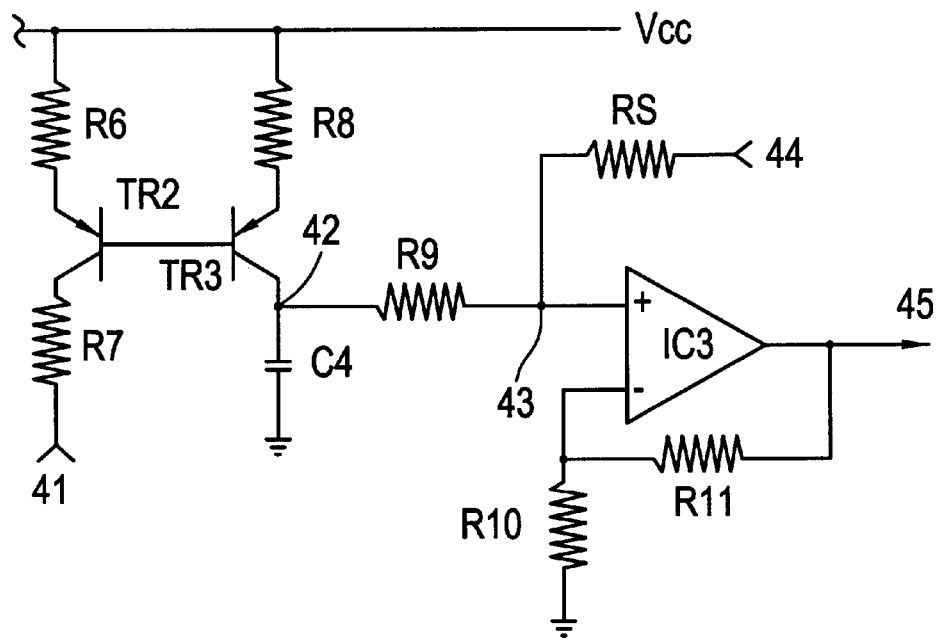
FIG. 4 is a circuit diagram of triggered ramp generator with initial offset voltage.
Figure 5:
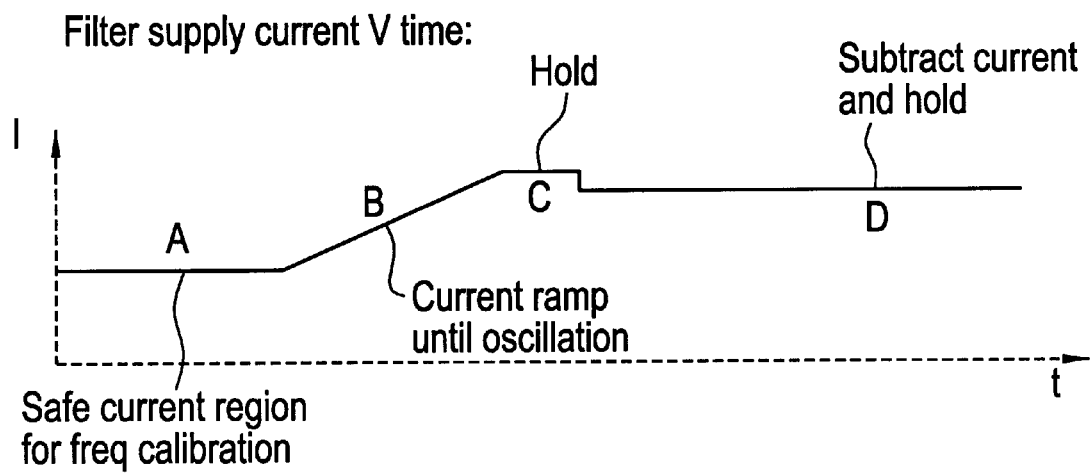
FIG. 5 is a graph showing the plot of filter supply current versus time.

Circuits suitable for implementation of calibration of the passband active filter 8 are shown in FIGS. 2, 3 and 4 and the calibration method is further illustrated in FIG. 5. The energy detector with threshold is shown in FIG. 2 with an input sine wave presented at 21 and R1 and R2 providing bias for the diode D1. Owing to the non-linear action of D1 the input signal is rectified and appears as a voltage at R2. The comparator action is provided by IC1 and R3, R4 and R5. The resistors R4 and R5 set a high gain around IC1 such that when the input voltage at 21 is not equal to the reference voltage at 28, the output voltage at 29 is either a high state or a low state.

The sample and hold circuit shown in FIG. 3 has its input voltage at 31 with TR1 enabled so that the voltage across C3 follows the input voltage. At the designated time TR1 is made close circuit via hold_enable at 32 and the voltage at that time on C3 is held at the existing level because of the high impedance presented to C3 by the buffer amplifier IC2. Capacitor C3 is thus prevented from discharging and the voltage across the output at 33 is maintained at the level of the voltage across C3.

A triggered ramp generator with offset voltage is shown in FIG. 4 where the TR2 and TR3 combination is configured as a programmable constant current source and an enable voltage is applied at 41. Resistors R6 and R7 determine the current at node 42 and C4 integrates the constant current at node 42 producing a constant ramp voltage. At node 43, the constant offset voltage at 44 and the ramp voltage are summed. Integrated circuit IC3 acts as the summing amplifier with R10 and R11 setting the voltage gain for the output 45.

With reference to FIG. 5, a plot of filter supply current I versus time is illustrated. Part A of the plot is the safe current region for frequency calibration and part B, the ramp where the filter supply current is steadily increased to the level at part C at which oscillation of the filter occurs and the level is held. The reduced level of filter supply current to maintain stable operation of the filter is shown at part D.

The calibrator as described herein in which the passband active filter is part of a phase locked loop for operating channel selection in a radio may be implemented as part of an ASIC receiver.

While a preferred embodiments of the present invention have been described using specific terms, such description is for illustrative purposes only, and it is to be understood that changes and variations may be made without departing from the spirit or scope of the following claims.

What is claimed is:

1. A calibrator for stabilization of a passband active filter, comprising
    means for providing a steady increase in filter supply current from a low level at which low level filter stability is assured to a high level at which high level instability occurs; and
    means for setting said filter supply current at a level less by a pre-determined amount than the high level at which instability occurs.

2. A calibrator for stabilization of a passband active filter as in claim 1 in which said passband active filter is part of a phase locked loop for operating channel selection in a radio.

3. A calibrator for stabilization of a passband active filter as in claim 1 in which the means for providing a steady increase in filter supply current from a low level at which filter stability is assured to a high level at which instability occurs includes a triggered ramp generator with initial offset voltage, an energy detector with threshold detect and a sample and hold circuit.

4. A calibrator for stabilization of a passband active filter as in claim 2 in which the means for providing a steady increase in filter supply current from a low level at which filter stability is assured to a high level at which instability occurs includes a triggered ramp generator with initial offset voltage, an energy detector with threshold detect and a sample and hold circuit.

5. A calibrator for stabilization of a passband active filter as in claims 1 in which the calibrator is implemented as part of an ASIC receiver.

6. A calibrator for stabilization of a passband active filter as in claims 2 in which the calibrator is implemented as part of an ASIC receiver.

7. A calibrator for stabilization of a passband active filter as in claims 3 in which the calibrator is implemented as part of an ASIC receiver.

8. A calibrator for stabilization of a passband active filter as in claims 4 in which the calibrator is implemented as part of an ASIC receiver.

9. A method of calibrating a passband active filter, comprising the steps of:

setting a low level of filter supply current to provide filter stability;

tuning the filter to the required passband;

ramping up the supply current level;

monitoring the filter for instability;

holding the supply current level when instability is detected;

reducing the supply current by a predetermined amount from the held value; and re-tuning the passband active filter.

* * * * *